United States Patent [19]

Bergmann

[11] 4,266,150

[45] May 5, 1981

[54] CIRCUIT ARRANGEMENT FOR OPERATING ELECTROMECHANICAL SWITCHING DEVICES

[75] Inventor: Günther Bergmann, Blaustein-Arnegg, Fed. Rep. of Germany

[73] Assignee: LICENTIA Patent-Verwaltungs-G.m.b.H., Frankfurt am Main, Fed. Rep. of Germany

[21] Appl. No.: 940,828

[22] Filed: Sep. 8, 1978

[30] Foreign Application Priority Data

Sep. 10, 1977 [DE] Fed. Rep. of Germany ....... 2740833

[51] Int. Cl.³ .............................................. H03K 4/02
[52] U.S. Cl. .................................. 307/268; 307/227; 307/263; 328/186; 357/92
[58] Field of Search ............... 307/261, 264, 268, 227, 307/263; 328/14, 162, 165, 127, 128, 186; 357/92

[56] References Cited

U.S. PATENT DOCUMENTS

| | | | |
|---|---|---|---|
| 3,558,927 | 1/1971 | Whitehouse | 307/264 |
| 3,628,061 | 12/1971 | Jackman | 328/127 X |

FOREIGN PATENT DOCUMENTS 71789  3/1970 Fed. Rep. of Germany .
1341969 12/1973 United Kingdom .

*Primary Examiner*—John Zazworsky
*Attorney, Agent, or Firm*—Spencer & Kaye

[57] ABSTRACT

A circuit for operating an electromechanical switching mechanism in response to steep-edged electrical stepping pulses, including a pulse shaping stage connected between the source of such stepping pulses and the switching mechanism to convert the stepping pulses into a stepping signal having edges of reduced steepness.

10 Claims, 6 Drawing Figures

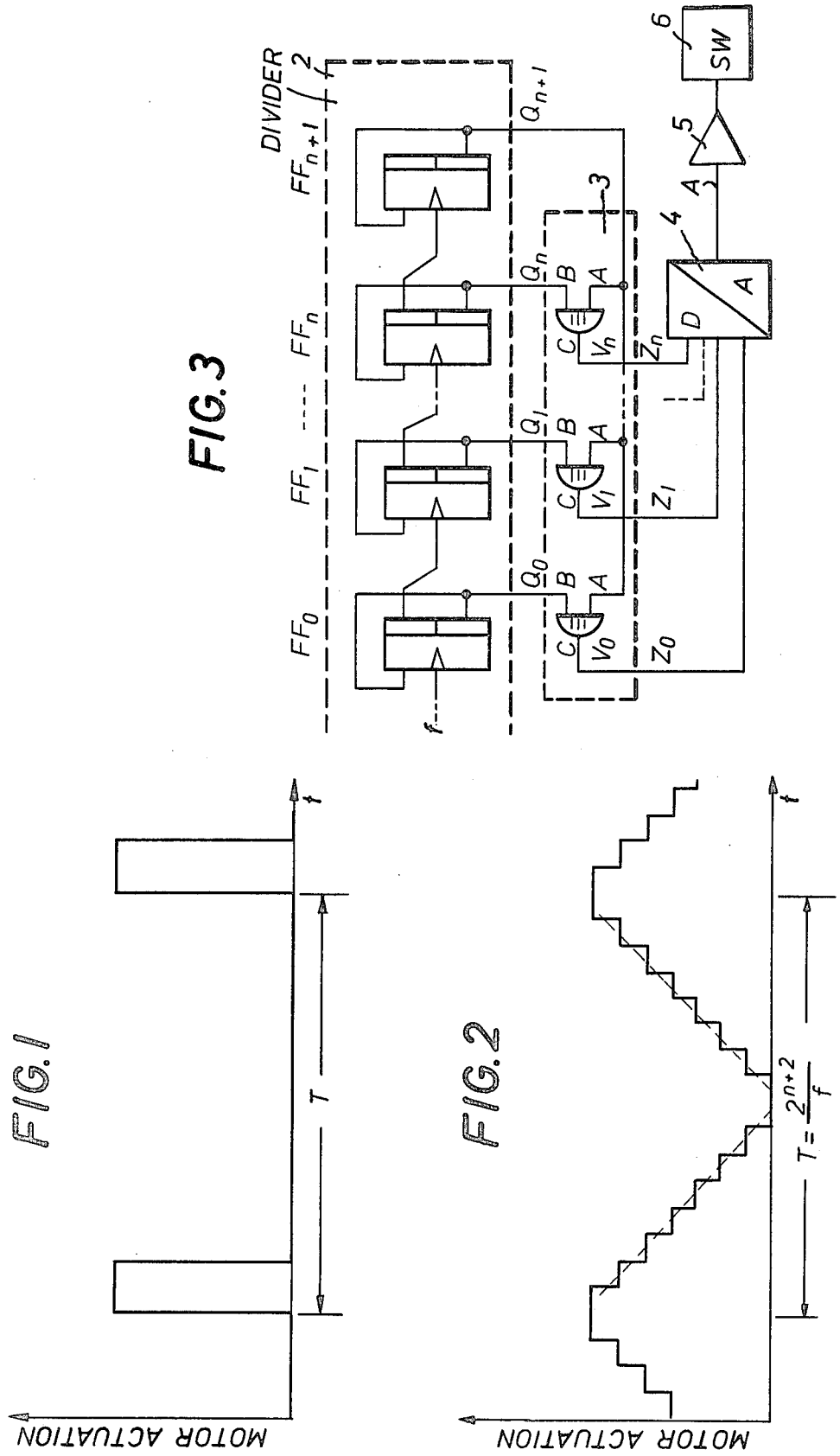

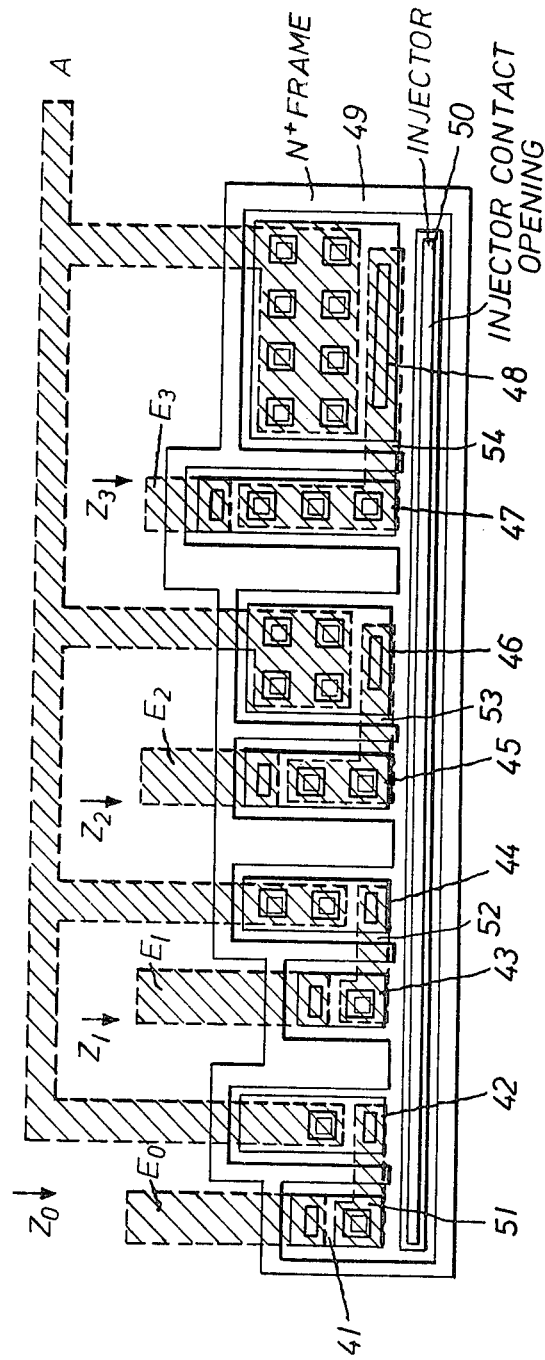

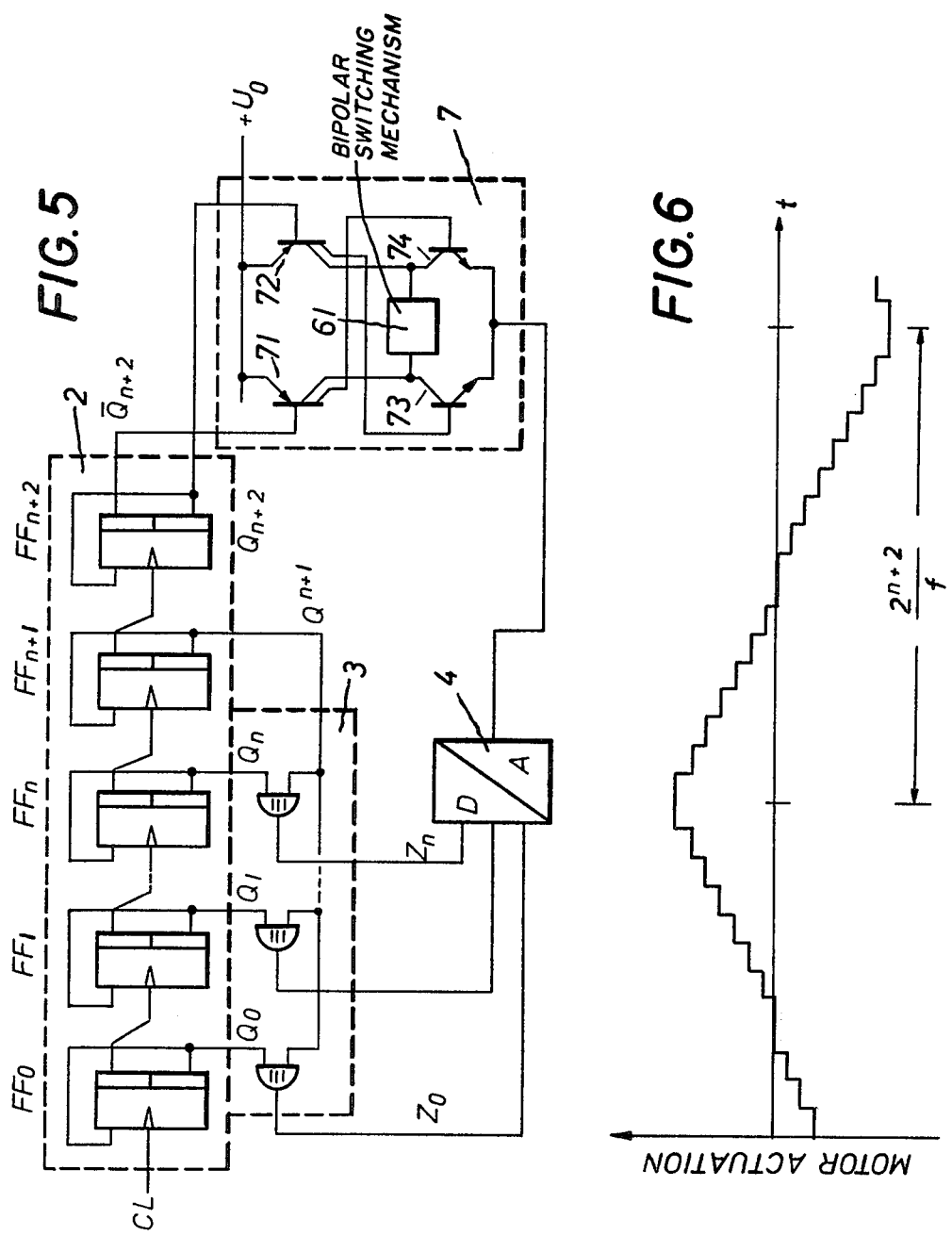

CIRCUIT ARRANGEMENT FOR OPERATING ELECTROMECHANICAL SWITCHING DEVICES

BACKGROUND OF THE INVENTION

The present invention relates to a circuit arrangement for operating electromechanical switching systems by means of electrical stepping pulses.

Electromechanical switching mechanisms operated by means of electrical pulses include, for example, relays, signal generators, stepping switches, etc. Particularly for driving electrical time keeping instruments, so-called stepping motors are used as switching mechanisms. A particular drawback of such switching systems is that they often develop annoying noise signals.

SUMMARY OF THE INVENTION

It is therefore an object of the present invention to improve a circuit arrangement of the above-mentioned type so that the switching system develops as little noise as possible.

A further object of the invention is to provide circuit arrangements for this purpose which are highly compact and economical, and which are, in particular, readily integratable.

The present invention is based on the realization that the main cause of noise development is the steep edges of the switching pulses provided to operate the switching mechanisms.

The present invention solves this problem by connecting a pulse shaping stage ahead of the switching mechanism so as to reduce the steepness of the edges of the stepping pulses. The solution offered by the present invention has been found to greatly reduce noise development.

According to a particularly favorable approach, the pulse shaping stage is arranged to convert the switching pulses into generally ramp-shaped signals, which can be produced particularly easily by means of integrated circuits.

If, as in a frequently encountered arrangement, the stepping pulses are obtained from a frequency divider circuit which is controlled by a clock pulse generator, the pulse shaping stage can be provided in a simple manner by connecting a logic linkage circuit followed by a digital/analog converter to the frequency divider circuit. The pulse shaping stage, clock pulse generator and frequency divider circuit can then be integrated on a single semiconductor chip, and will thus have few leads, and can therefore be economically and dependably integrated in a space-saving arrangement.

The integration can be effected according to MOS techniques as well as in integrated injection logic (I²L). Both types of circuitry are distinguished by low consumption of electrical energy.

When I²L circuits are used, which includes lateral transistors of one conductivity type and associated vertical transistors of the other conductivity type which act as inverters, there results the further advantage that the D/A converter can be constructed particularly easily by geometrically graduating its lateral transistors and/or the collector areas of its vertical transistors.

According to one embodiment of the present invention, only a single D/A converter is required.

BRIEF DESCRIPTION OF THE DRAWINGS

FIG. 1 is a signal diagram showing a typical waveform of stepping pulses according to the prior art.

FIG. 2 is a diagram similar to that of FIG. 1 of a ramp-shaped stepping signal according to the present invention.

FIG. 3 is a block circuit diagram of an arrangement according to the invention for forming a unipolar, ramp-shaped stepping signal.

FIG. 4 shows the basic layout of an I²L digital-/analog converter which can be used in the circuit of FIG. 3.

FIG. 5 is a circuit diagram of an arrangement according to the invention for forming a bipolar ramp-shaped stepping signal.

FIG. 6 is a signal diagram showing the waveform of the bipolar ramp-shaped stepping signal produced by the circuit arrangement of FIG. 5.

DESCRIPTION OF THE PREFERRED EMBODIMENTS

FIG. 1 shows the rectangular shape of the pulses used in the prior art for actuating switching mechanisms, particularly stepping switches. The steep edges of such pulses produce high acceleration forces at the movable parts of the switching mechanisms and thus noise development, which becomes particularly annoying in clocks which are operated by stepping motors.

A significantly quiet movement of the stepping switch mechanisms can be realized, however, when a pulse shaping stage is connected ahead of the switching mechanism to reduce the average edge steepness of the stepping pulses.

In the simplest case, the steepness of the pulse edges could be reduced by the action of a resistor-capacitor combination connected to the switching mechanism. But in many cases this would require high capacitance values which cannot be obtained in integrated actuating circuits.

On the other hand, a pulse shaping stage which converts the rectangular stepping pulses into ramp-shaped stepping signals would be readily integratable. A signal with such a ramp-shaped curve is shown, for example in FIG. 2. The period T, the time between signal peaks, is the same as the pulse period T in FIG. 1. The curve shown in FIG. 2 is one in which the ramp-shaped signal is approximated by a step-shaped signal sequence. A step-shaped curve can be produced particularly easily by an integrated pulse shaping stage. This will be explained for the example of a circuit arrangement for a switching mechanism which normally receives the rectangular stepping pulses from a divider circuit that is controlled by a clock pulse generator so as to produce output signals of the type shown in FIG. 1.

FIG. 3 illustrates one circuit arrangement for producing a stepping signal having the form shown in FIG. 2. The circuit includes a frequency divider circuit 2, which is controlled by a clock pulse generator (not shown), and a logic linkage circuit 3 and series connected D/A converter 4 are connected to the frequency divider circuit to act as the pulse shaping stage. Only that part of the frequency divider circuit 2 is shown which is connected to the pulse shaping stage. Therefore, the frequency f of the clock pulse signal which controls the illustrated portion of the frequency divider circuit is already substantially lower than the frequency of the output of the clock pulse generator (not shown).

The frequency divider circuit 2 is preferably a binary divider composed of feedback connected, edge-triggered delay flip-flops. Such a flip-flop employs only six linkage members and can therefore be fabricated particularly well as an I²L device. An I²L binary divider for this purpose is disclosed, for example, in German Offenlegungsschrift [Laid-open Application] No. 25 06 916 and U.S. Pat. No. 3,964,251.

The logic linkage circuit 3 of the pulse shaping circuit is connected to the part of the frequency divider circuit 2 shown in FIG. 3 which includes the stages $FF_0$ to $FF_{n+1}$. The outputs of one type, i.e. always only the noninverting outputs or always only the inverting outputs, of the divider stages $FF_0$, $FF_1$, . . . $FF_n$ are each connected to one input of a respective equivalence, or coincidence, member $V_0$, $V_1$, . . . $V_n$ associated with each divider stage. The second input of each equivalence member is connected to the output of one type, of the last divider stage $FF_{n+1}$.

Each member V operates to produce a logic 1 when identical logic signals are at its inputs, and otherwise produces logic 0's. The following table sets forth, for a circuit in which n=2, the sequence of outputs from flip-flops FF and members V, as well as the corresponding output signal A from D/A converter 4.

TABLE

| $Q_0$ | $Q_1$ | $Q_2$ | $Q_3$ | $Z_0$ | $Z_1$ | $Z_2$ | A |
|---|---|---|---|---|---|---|---|
| 0 | 0 | 0 | 0 | 1 | 1 | 1 | 7 |
| 1 | 0 | 0 | 0 | 0 | 1 | 1 | 6 |
| 0 | 1 | 0 | 0 | 1 | 0 | 1 | 5 |
| 1 | 1 | 0 | 0 | 0 | 0 | 1 | 4 |
| 0 | 0 | 1 | 0 | 1 | 1 | 0 | 3 |
| 1 | 0 | 1 | 0 | 0 | 1 | 0 | 2 |
| 0 | 1 | 1 | 0 | 1 | 0 | 0 | 1 |
| 1 | 1 | 1 | 0 | 0 | 0 | 0 | 0 |
| 0 | 0 | 0 | 1 | 0 | 0 | 0 | 0 |
| 1 | 0 | 0 | 1 | 1 | 0 | 0 | 1 |
| 0 | 1 | 0 | 1 | 0 | 1 | 0 | 2 |
| 1 | 1 | 0 | 1 | 1 | 1 | 0 | 3 |
| 0 | 0 | 1 | 1 | 0 | 0 | 1 | 4 |
| 1 | 0 | 1 | 1 | 1 | 0 | 1 | 5 |
| 0 | 1 | 1 | 1 | 0 | 1 | 1 | 6 |
| 1 | 1 | 1 | 1 | 1 | 1 | 1 | 7 |
| (0 | 0 | 0 | 0 | 1 | 1 | 1 | 7) |
| etc. | | | | | | | |

The above table shows the logic output levels $Z_0$, $Z_1$ and $Z_2$ for the respective logic output levels $Q_0$, $Q_1$ . . . $Q_{n+1}$ when n=2. These output signals Z are fed in parallel to the digital/analog converter 4 which converts these digital binary output values from the logic linkage circuit 3 into analog signals. If, for example, the D/A converter 4 evaluates the logic 1 values of the signal $Z_0$ as 1, of the signal $Z_1$ as 2 and of the signal $Z_2$ as 4, and then adds the evaluated signals, the signal A appearing at its output will have the values shown in the last column of the table, and plotted over time in FIG. 2. In FIG. 2, f is the frequency of the clock pulse signal to flip-flop $FF_0$ in FIG. 3.

With sufficient output power, the output signals from the D/A converter 4 can be directly fed to the switching mechanism 6, otherwise they are delivered via an amplifier 5. While linkage members V of the logic linkage circuit 3 shown in FIG. 3 are equivalence members, the same ramp-shaped signal can be obtained if the equivalence members are replaced by exclusive or-members, also called modulo-2 adders.

If the stepping signal is to have another shape than the one shown in FIG. 2, either the frequency divider must be connected so that it performs in the desired counting mode or the binary signals obtained from the individual stages $FF_0$ to $FF_n$ must be recoded. For this purpose it is advisable to convert the binary signal presenting the binary levels $Q_0$ to $Q_n$ to a 1-of-$2^n$ code and to actuate a fixed value memory matrix from which the desired code can be obtained for feeding into the D/A converter 4. In this way any desired time sequence shapes of the stepping signal can be produced. This seemingly more complicated solution, which, however, may be quite advantageous for some cases, can be realized in an economical manner if the fixed value memory is also an I²L device and is integrated in the same semiconductor chip with the remaining components of the actuating circuit.

The fabrication of the digital/analog converter 4 as an I²L device will now be described. As is known, in I²L circuit units, NPN inverter transistors are fed by PNP transistors, so-called injectors. The current from an NPN inverter transistor which is available as collector current is here a function of the geometric dimensions of the lateral transistor and, in contradistinction to the injector, the inverter transistor is arranged in vertical orientation with respect to the semiconductor chip. By geometrically graduating the dimensions of the lateral transistor as well as the collector areas of the NPN transistors, the current graduation required for the digital/analog conversion can be realized.

FIG. 4 shows the layout scheme for a 4-bit I²L D/A converter, i.e. for a pulse shaping circuit in which n=3. The illustrated layout for the digital/analog converter can be realized very easily in I²L technique so that a digital/analog converter of such design can also be used to advantage in other cases where digital/analog conversion is required. It operates according to the principle of an evaluation coder and for this reason has a predominantly geometric graduation of the collector areas of its vertical NPN transistors.

In FIG. 4, $E_0$, $E_1$, $E_2$ and $E_3$ are the four input electrodes of the D/A converter 4 to which the input signals $Z_0$, $Z_1$, $Z_2$ and $Z_3$ can be applied. The output of the D/A converter appears at electrode terminal A.

The principle of integrated injection logic (I²L) circuits will not be discussed in detail here. It is described in detail, for example, in Valvo Berichte [Valvo Reports] Vol. XVIII, issue 1/2 (1974), pages 215–266 and in U.S. Pat. No. 3,736,477. In addition, various details of circuits of this type are disclosed, for example, in U.S. Pat Nos. 3,964,251; 3,965,666; 3,986,199; and 4,013,901.

In the circuit shown in FIG. 4, an injector 50 feeds the vertical transistors 41 to 48 which are arranged perpendicularly to the plane of the drawing. The transistors 42, 44, 46 and 48 are output transistors, which are switched on by the injector current or can be blocked by the actuating transistors 41, 43, 45 and 47. Metal conductor lines or strips are shown in broken lines with hatching.

For instance, the input electrode $E_O$ (input $Z_O$) contacts the base of the vertical actuating transistor 41. The collector of actuating transistor 41 is connected via a conducting line 51 with the base of output transistor 42. The collector of actuating transistor 42 is connected with the output A of the D/A converter via a conducting line. The additional stages consisting of transistors 43, 44, 45, 46 and 47, 48 are constructed in the same manner.

A separation frame 49, which is an N+ frame on an N substrate, serves to separate the individual component units from one another. The N+ frame 49 is connected to ground or reference potential and forms the emitter of all vertical transistors 41 through 48. The injector is fed with a constant current (for instance, using a voltage source and a resistor).

Each of the actuating transistors 41, 43, 45 and 47 has its base connected to a respective one of the input electrodes $E_0$, $E_1$, $E_2$ or $E_3$ in the illustrated manner. The collector of each actuating transistor is connected to the base of a respective one of associated output transistor 42, 44, 46 or 48 via interconnection lines 51, 52, 53, 54.

The collector areas of the output transistors 44, 46 and 48 are enlarged, as shown in FIG. 4, in that they are constituted by two, four and eight, respectively, parallel connected vertical output transistors each having a common base and connected in parallel with the output electrode, and thus with output A. Due to their current consumption, which corresponds to their respective total area, the base area of each such transistor is also correspondingly enlarged. Because of the relatively low current gain factor of the output transistors, it is generally necessary to also provide a high base current which corresponds to the high collector current. For this purpose, a corresponding plurality of vertical transistors is also provided in parallel with a base of each of actuating transistors 45 and 47. In the illustrated embodiment, for example, the actuating transistor 45 includes two parallel connected vertical transistors and the actuating transistor 47 includes three parallel connected vertical transistors.

The areas between the injector electrode 50 and the base areas of the output transistors, and those between the injector electrode 50 and the base areas of the actuating transistors, act as lateral transistors. Due to the respective arrangement of the parallel connected output transistors, this produces an additional geometric graduation of the lateral transistor areas. This is particularly evident from a comparison of the opposing faces between the base of the output transistor 48 and the injector electrode 50 with the opposing faces between the base of the output transistor 42 and the injector electrode 50, the latter area being substantially smaller than the former.

The digital/analog converter according to FIG. 4 can be integrated in an advantageous manner on a semiconductor chip together with the linkage circuit 3, the divider circuit 2, the clock pulse generator and, if necessary, the amplifier 5, and can thus be produced with very small dimensions and few external leads which results in high dependability of the actuating circuit.

FIG. 5 shows a circuit arrangement for driving a bipolar switching mechanism 61, for example a bipolar stepping motor. The same units with the same function as in the previously shown embodiments are given the same reference characters. The frequency divider circuit 2 here includes a further divider stage $FF_{n+2}$ for switching a transistor bridge circuit 7. The ramp-shaped actuation of the transistor bridge circuit is effected by D/A converter 4, possibly with the intermediary of an amplifier 5, which is not shown here.

The transistor bridge circuit 7 includes four transistors 71, 72, 73 and 74. The emitters of the transistors 73 and 74 are connected together and to the output of the D/A converter 4. The collectors of transistors 73 and 74, on the one hand, are connected with the two terminals of the bipolar switching system 61. Transistors 71 and 72 each have two separate collector terminals. One collector terminal of transistor 71 is connected to the collector of the transistor 73, the other to the base of transistor 74. Correspondingly, one collector terminal of transistor 72 is connected to the collector of transistor 74 and the other collector terminal is connected to the base of transistor 73. The emitters of transistors 71 and 72 are fed together from the positive pole of an operating voltage source $U_0$. Transistors 72 and 71 are actuated through their base by, respectively, the noninverted output signal $Q_{n+2}$ and the inverted output signal $\overline{Q_{n+2}}$ of the last divider stage $FF_{n+2}$. With this arrangement of the transistor bridge circuit 7, only one D/A converter 4 is required.

FIG. 6 shows the ramp-shaped signal waveforms produced across switching system 61 by the circuit arrangement of FIG. 5. As can be seen, the circuit arrangement furnishes a total of $2^{n+2}$ steps per signal pulse edge.

It will be understood that the above description of the present invention is susceptible to various modifications, changes and adaptations, and the same are intended to be comprehended within the meaning and range of equivalents of the appended claims.

A useful switching mechanism is manufactured by Gebr. Staiger, POB 34, 7742 St. Georgen, West Germany under part number 0250-51. It operates with pulses of one polarity. A bipolar counterpart is manufactured by Kienzle Uhrenfabriken, POB 91, 7720 Schwenningen, West Germany under part number W 711.

What is claimed is:

1. In arrangement for operating an electromechanical switching mechanism in response to electrical stepping pulses including a source of such stepping pulses constituted by a frequency divider circuit receiving input pulses from a clock pulse generator, and a pulse shaping circuit connected between said frequency divider circuit and said switching mechanism for providing a stepping signal having a ramp-shaped waveform at its leading and trailing edges, said pulse shaping circuit comprising a logic linkage circuit connected to said frequency divider circuit, and a D/A converter connected to the output of said logic linkage circuit, the improvement wherein:

said logic linkage circuit includes a plurality of like logic elements, each having two inputs and an output;

said frequency divider circuit includes a like plurality of frequency divider stages connected in cascade with a further frequency divider stage connected to the output of said like plurality of frequency divider stages; and each of said logic elements has one of its said inputs connected to an output of an associated respective one of said like plurality of frequency divider stages, the other of its said inputs connected to a common output of said further frequency divider stage, and its output connected with a respective input of said D/A converter.

2. Arrangement as defined in claim 1 wherein said pulse shaping stage is constituted by an integrated circuit formed on a semiconductor chip together with the clock pulse generator and the frequency divider circuit.

3. Arrangement as defined in claim 2 wherein said integrated circuit is an $I^2L$ circuit including lateral transistors of one conductivity type and associated vertical transistors of the opposite conductivity type which act as inverters, at least some of which transistors constitute said D/A converter, and the lateral transistors and the collector areas of the vertical transistors of the D/A converter are geometrically graduated.

4. The arrangement as defined in claim 1 wherein said logic elements are equivalence circuits.

5. The arrangement as defined in claim 1 or claim 4 wherein n+1 of said logic elements are provided to produce $2^{n+1}$ steps of said ramp-shaped waveform where n=1,2 ....

6. The arrangement as defined in claim 1 or 4 wherein said inputs of said logic elements are connected to like outputs of said frequency divider stages.

7. The arrangement as defined in claim 1 or claim 4 for operating a bipolarly operated switching mechanism and further comprising: another frequency divider stage, having a direct output and an inverted output, connected in cascade with the output of said further frequency divider stage; and a transistor bridge circuit connected to conduct said stepping signal to said switching mechanism, said bridge circuit being connected to said outputs of said additional frequency divider stage and to the output of said D/A converter to be actuated by the signals thereat.

8. In a circuit arrangement for operating an electromechanical switching mechanism in response to electrical stepping pulses including a source of such stepping pulses constituted by a frequency divider circuit receiving input pulses from a clock pulse generator, and a pulse shaping circuit connected between said frequency divider circuit and said switching mechanism for providing a stepping signal having a ramp-shaped waveform at its leading and trailing edges, said pulse shaping circuit including a logic linkage circuit connected to said frequency divider circuit, and a D/A converter connected to the output of said logic linkage circuit, the improvement wherein: said pulse shaping circuit is constituted by an integrated circuit formed on a semiconductor chip together with the clock pulse generator and the frequency divider circuit; and said integrated circuit is an I²L circuit including lateral transistors of one conductivity type and associated vertical transistors of the opposite conductivity type which act as inverters, at least some of which transistors constitute said D/A converter, and the lateral transistors and the collector areas of the vertical transistors of the D/A converter are geometrically graduated.

9. Arrangement as defined in claim 8, for operating a bipolarly operated switching mechanism and including a transistor bridge circuit connected to conduct the stepping signal to the switching mechanism, wherein said frequency divider circuit is composed of a plurality of stages connected together in series, with at least the last stage having a direct output and an inverted output, and said bridge circuit is connected to the outputs of said last divider stage and to the output of said D/A converter to be actuated by the signals thereat.

10. In a circuit arrangement for operating an electromechanical switching mechanism in response to electrical stepping pulses including a source of said stepping pulses constituted by a frequency divider circuit receiving input pulses from a clock pulse generator and a pulse shaping circuit connected between said frequency divider circuit and said switching mechanism for providing a stepping signal having a ramp-shaped waveform at its leading and trailing edges, said pulse shaping circuit including a logic linkage circuit connected to said frequency divider circuit and a D/A converter connected to the output of said logic linkage circuit, the improvement wherein, for operating a bipolarly operated switching mechanism, said circuit arrangement further includes a transistor bridge circuit connected to conduct the stepping signal to the switching mechanism, said frequency divider stage is composed of a plurality of stages connected together in series with at least the last stage having a direct output and an inverted output, and said bridge circuit is connected to said outputs of said last divider stage and to the output of said D/A converter to be activated by the signals thereat.

* * * * *